United States Patent [19]

Edwards

[11] Patent Number: 5,047,662
[45] Date of Patent: Sep. 10, 1991

[54] INDUCTIVE LOAD DRIVING CIRCUIT WITH INDUCTIVELY INDUCED VOLTAGE COMPENSATING MEANS

[75] Inventor: Arthur J. Edwards, Hoffmann Estates, Ill.

[73] Assignee: Motorola, Inc., Schaumburg, Ill.

[21] Appl. No.: 399,147

[22] Filed: Aug. 28, 1989

[51] Int. Cl.⁵ .............................................. H03K 5/00
[52] U.S. Cl. .................................. 307/296.4; 361/18; 361/92; 361/173; 361/189; 361/160; 307/270
[58] Field of Search ............... 307/454, 253, 254, 255, 307/296.4, 263, 270; 361/18, 84, 92, 173, 189, 190, 160

[56] References Cited

U.S. PATENT DOCUMENTS

| | | | |
|---|---|---|---|
| 3,648,145 | 3/1972 | Meyer et al. | 361/88 |
| 3,809,963 | 7/1974 | Hutchinson | 361/88 |
| 3,860,855 | 1/1975 | Caswell | 361/18 |
| 4,570,198 | 2/1986 | Storti et al. | 361/18 |
| 4,578,734 | 3/1986 | Delbosse | 361/190 |
| 4,896,244 | 7/1990 | Kaling | 307/296.4 |
| 4,945,358 | 7/1990 | Wrzesinski | 361/18 |
| 4,947,283 | 8/1990 | Kono | 361/190 |

FOREIGN PATENT DOCUMENTS

| | | | |
|---|---|---|---|
| 0080874 | 6/1983 | European Pat. Off. | 307/296.4 |
| 1145332 | 3/1985 | U.S.S.R. | 361/18 |

Primary Examiner—Stanley D. Miller
Assistant Examiner—T. Cunningham

[57] ABSTRACT

A driver circuit for driving from the same output node (6) an inductive relay (34) and a non-inductive lamp (30) having a transistor (16) for driving the relay and second transistor (18) for driving the lamp and a third transistor (90) having its current electrodes coupled between the control electrodes of the first and second transistors for sensing an inductively-induced voltage at the output node when the first transistor means is disabled to cease driving the relay and for enabling the first transistor in response thereto to dissipate the inductively-induced voltage at the output node so as to protect the second transistor. Alternative couplings of the third transistor to the second transistor are also disclosed.

9 Claims, 2 Drawing Sheets

INDUCTIVE LOAD DRIVING CIRCUIT WITH INDUCTIVELY INDUCED VOLTAGE COMPENSATING MEANS

BACKGROUND OF THE INVENTION

This invention relates to a driver circuit for driving both an inductive load and a non-inductive load connected to the same output node of the driver circuit. Such circuits find use in, for example, automotive applications for driving inductive loads such as relays and non-inductive loads such as lamps from the same output node.

In a typical such combined automotive lamp and relay driver circuit a first driver transistor is provided to drive a relay connected to an output node and a second driver transistor is provided to drive a lamp connected to the output node, the first and second driver transistors being connected in series via the output node and the lamp and relay also being connected in series via the output node.

In use of such an arrangement the first driver transistor is turned "on" and the second driver transistor is turned "off" to drive the relay, whereas the first driver transistor is turned "off" and the second driver transistor is turned "on" to drive the lamp. Under normal operating conditions, logic circuitry ensures that only one of the first and second driver transistors is conducting at any one time. Problems may arise, however, when it becomes necessary to cease driving the relay and begin driving the lamp, i.e. when the first driver transistor is switched from "on" to "off" and the second driver transistor is switched from "off" to "on". When the first driver transistor switches from "on" to "off", the inductance of the relay forces an inductive voltage at the output node in order to keep a constant current through the relay.

The second driver transistor may commonly be provided in the form of a Darlington transistor. Such transistors are commonly provided with internal base-emitter "speed-up" resistors which have associated therewith a parasitic diode component connected across the current electrodes of the transistor. If a transistor with such a diode is used, the diode limits the induced voltage at the output node and allows a dissipation path for the induced current. When the induced energy is dissipated, the second driver transistor turns "on" normally.

Unfortunately, such a diode may not always be present: a high gain Darlington transistor may be needed as the second driver transistor and these typically do not incorporate such "speed-up" resistors and associated diode. Without such a diode the collector-emitter reverse voltage of the transistor is not clamped until the base-emitter junction breaks down in reverse. This is highly undesirable as it may significantly reduce the hFE performance of the transistor in a short time.

SUMMARY OF THE INVENTION

It is an object of the present invention to provide an improved driver circuit wherein the above disadvantages may be overcome or at least alleviated.

In accordance with a first aspect of the present invention there is provided a driver circuit comprising:
an output node;
first transistor means for driving a substantially inductive load connected to the output node, the first transistor means having a current electrode coupled to the output node and having a control electrode;
second transistor means for driving a substantially non-inductive load connected to the output node, the second transistor means having a current electrode coupled to the output node and having a control electrode; and
compensating means for sensing an inductively-induced voltage at the output node when the first transistor means is disabled to cease driving the substantially inductive load and for enabling the first transistor means in response thereto to dissipate the inductively-induced voltage at the output node so as to protect the second transistor means.

In a preferred form the driver circuit comprises:
an output node;
first transistor means for driving a substantially inductive load connected to the output node, the first transistor means having a current electrode coupled to the output node and having a control electrode;
second transistor means for driving a substantially non-inductive load connected to the output node, the second transistor means having a current electrode coupled to the output node and having a control electrode; and
third transistor means having a first current electrode coupled to the control electrode of the first transistor means, and a second current electrode connected to the output node for sensing an inductively-induced voltage at the output node when the first transistor means is disabled to cease driving the substantially inductive load and for enabling the first transistor means in response thereto to dissipate the inductively-induced voltage at the output node so as to protect the second transistor means.

In accordance with a second aspect of the present invention there is provided an integrated circuit for enabling first transistor means for driving a substantially inductive load connected to an output node and second transistor means for driving a substantially non-inductive load connected to the output node, the integrated circuit comprising:
a first terminal for connection to a control electrode of the first transistor means;
first pre-driver means connected to the first terminal for enabling the first transistor means;
a second terminal for connection to a control electrode of the second transistor means;
second pre-driver means connected to the second terminal for enabling the second transistor means; and
compensating means coupled between the first and second terminals for sensing an inductively-induced voltage at the output node when the first transistor means is disabled to cease driving the substantially inductive load and for re-enabling the first transistor means in response thereto to dissipate the inductively-induced voltage at the output node so as to protect the second transistor means.

BRIEF DESCRIPTION OF THE DRAWINGS

Two automotive combined lamp and relay driver circuits in accordance with the present invention will now be described with reference to the accompanying drawings, in which.

DESCRIPTION OF THE PREFERRED EMBODIMENTS

Figure 1:
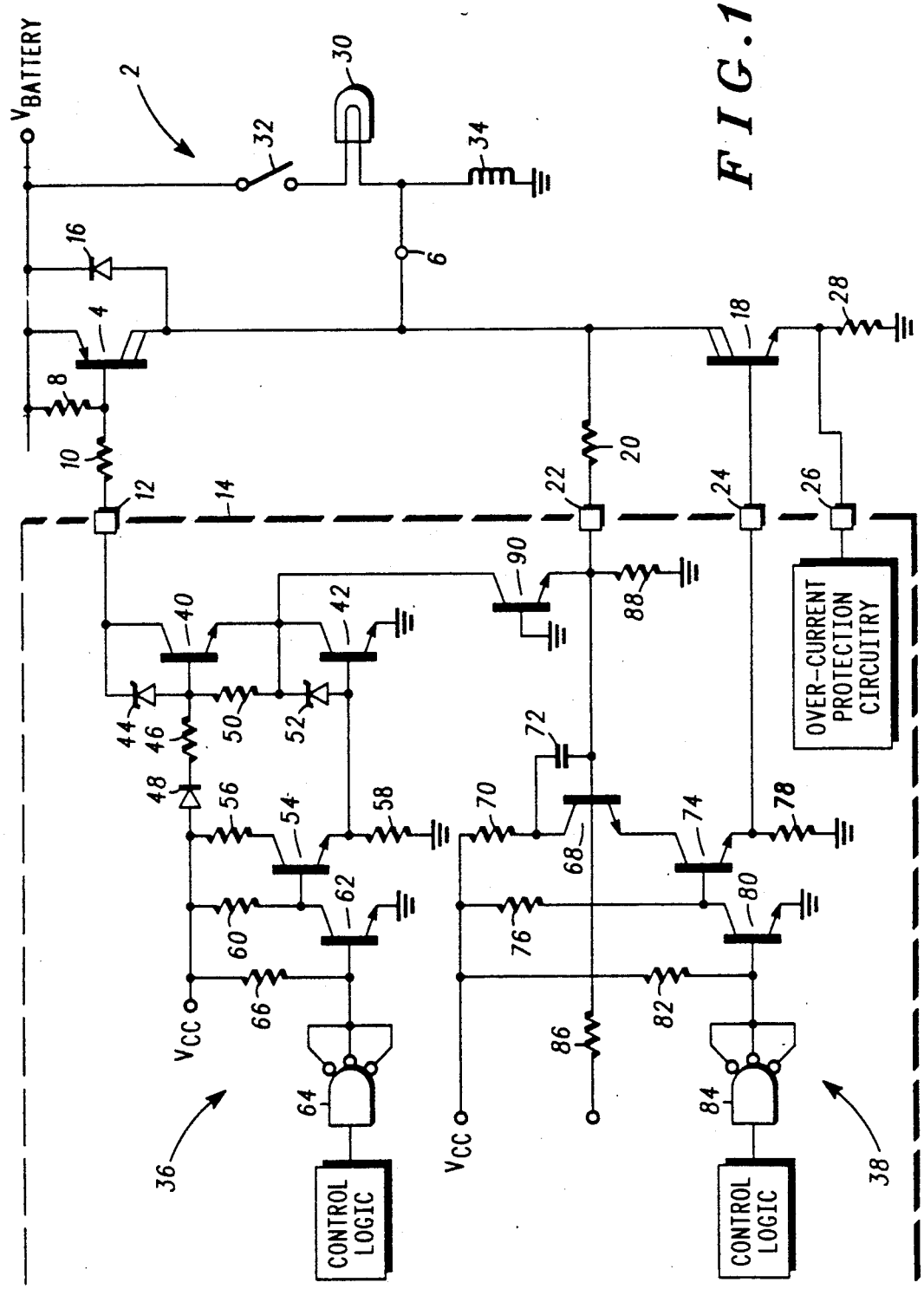
FIG. 1 shows a circuit diagram of a first automotive combined lamp and relay driver circuit.

Referring now to FIG. 1, a first automotive combined lamp and relay driver circuit 2 includes a pnp bipolar Darlington transistor 4. The transistor 4 has its emitter connected to a supply line for connection to automobile battery voltage $V_{BATTERY}$, has its collector connected to an output terminal 6, and has its base connected, via a resistor 8, to the battery voltage supply line. The base of the transistor 4 is also connected, via a resistor 10 to a terminal 12 of a control integrated circuit (IC) 14, which will subsequently be described in greater detail. The transistor 4 is provided with a parasitic diode 16 connected across its current electrodes, as is well-known in the art.

A npn bipolar Darlington transistor 18 has its collector connected to the output terminal 6 and, via a resistor 20, to a terminal 22 of the control IC 14. The transistor 18 has its base connected to a terminal 24 of the control IC 14. The transistor 18 has its emitter connected to a terminal 26 of the control IC 14 and, via a resistor 28, to ground.

A lamp 30 is connected between the battery voltage supply line, via a switch 32, and the output terminal 6. A relay 34 is connected between the output terminal 6 and ground.

The control IC 14 includes a relay pre-driver portion 36 and a lamp pre-driver portion 38.

The relay pre-driver portion 36 includes npn bipolar transistors 40 and 42 connected in cascode arrangement. The transistor 40 has its collector connected to IC terminal 12, and has its base connected, via Zener diode 44, to its collector. The base of transistor 40 is also connected, via resistor 46 and diode 48, to a supply line for connection to a supply voltage $V_{cc}$. The base of transistor 40 is also connected, via resistor 50, to its emitter. The transistor 42 has its collector connected to the emitter of transistor 40, and has its base connected, via Zener diode 52, to its collector. The transistor 42 has its emitter connected to ground.

The relay pre-driver portion 36 also includes a npn bipolar transistor 54 having its collector connected, via resistor 56, to the supply line $V_{cc}$. The transistor 54 has its emitter connected to the base of transistor 42 and, via resistor 58, to ground. The transistor 54 has its base connected, via resistor 60, to the supply line $V_{cc}$. The relay pre-driver portion also includes a npn bipolar transistor 62 having its collector connected to the base of transistor, and having its emitter connected to ground. The transistor 62 has its base connected, via buffer logic gate 64, to control logic. The base of transistor 62 is also connected, via resistor 66, to the supply line $V_{cc}$.

The lamp pre-driver portion 38 includes a npn bipolar transistor 68 having its collector connected, via resistor 70, to the supply line $V_{cc}$. The transistor 68 has its base connected to the IC terminal 22, and, via capacitor 72, to its collector. The lamp pre-driver portion 38 also includes a npn bipolar transistor 74 having its base connected, via resistor 76, to the supply line $V_{cc}$. The transistor 74 has its emitter connected to the IC terminal 24, and, via resistor 78, to ground. The transistor 74 has its collector connected to the emitter of transistor 68. The lamp pre-driver portion 38 also includes a npn bipolar transistor 80 having its base connected, via resistor 82, to the supply line $V_{cc}$. The transistor 80 has its emitter connected to ground, and has its base connected, via buffer logic gate 84, to control logic.

The IC terminal 26 is connected to over-current protection circuitry. The IC terminal 22 is connected, via a resistor 86, to power-up detection circuitry, and, via a resistor 88, to ground. The lamp pre-driver portion 38 also includes a npn bipolar transistor 90 having its base connected to ground, having its emitter connected to the IC terminal 22, and having its collector connected to the collector of transistor 42 in the relay pre-driver portion 36.

In use of the driver circuit of FIG. 1 with the switch 32 closed, when the relay 34 is to be energized, control logic causes buffer gate 64 to apply a low relay pre-driver enabling voltage to the base of transistor 62. Transistor 62 turns "off" and allows the base of transistor 54 to be pulled high. Transistor 54 turns "on", and pulls the base of transistor 42 high. Transistor 42 turns "on", pulling IC terminal 12 low, which turns on the Darlington transistor 4. At the same time, control logic causes buffer gate 84 to apply a high lamp pre-driver disabling voltage to the base of transistor 80. Transistor 80 turns "on" and pulls the base of transistor 74 low. Transistor 74 turns "off", causing the IC terminal 24 to be pulled low, and disabling the Darlington transistor 18. The output terminal 6 is therefore pulled high by the Darlington transistor 4 and current flows through the relay 34 to ground. It will be appreciated that the cascode arrangement of transistors 40 and 42 allows a higher voltage capability than would be provided by a single transistor.

When the lamp 30 is to be energized, control logic causes buffer gate 64 to apply a high relay pre-driver disabling voltage to the base of transistor 62. Transistor 62 turns "on" and pulls the base of transistor low. Transistor 54 turns "off", and allows the base of transistor 42 to be pulled high. Transistor 42 turns "on", producing a low voltage at IC terminal 12 which turns on the Darlington transistor 4. At the same time, control logic causes buffer gate 84 to apply a low lamp pre-driver disabling voltage to the base of transistor 80. Transistor 80 turns "off" and allows the base of transistor 74 to be pulled high. Transistor 74 turns "on", causing the IC terminal 24 to be pulled high, and enabling the Darlington transistor 18. The output terminal 6 is therefore pulled low by the Darlington transistor 18 and current flows through the lamp 30 to ground, illuminating the lamp.

However, when the relay 34 is de-energized, the inductance of the relay causes a negative voltage to be generated at the output terminal 6 which could harm the Darlington transistor 18. This potential harm is obviated in the following way. The negative voltage at the output terminal 6 is detected by the transistor 90 which normally serves to clamp the voltage at IC terminal 22 to a level approximately 0.7V below ground. When the inductively-induced negative voltage occurs at the output terminal 6, the transistor 90 causes a low voltage to be applied to the collector of transistor 42 in the relay pre-driver portion 36. This low voltage causes the transistor 40 to be turned "on", and hence the transistor 4 also conducts. Thus the IC terminal 12 is pulled low, enabling the Darlington transistor 4 until the negative voltage at the output terminal 6 has dissipated, at which time the IC terminal 12 goes high, disabling the Darlington transistor 4. The output terminal is then pulled to ground by conducting Darlington transistor 18, and current flows through the lamp 30 and through the Darlington transistor 18 to ground, illuminating the lamp as described above. Thus, the transistor 90 serves to clamp the voltage at the output terminal 6 to prevent the negative voltage induced at the terminal upon de-energizing of the relay 34 from damaging the transistor 18.

It will be appreciated that by connecting the collector of the transistor 90 to the collector of the transistor 42, rather than simply to ground as previously known, the potentially harmful effects of the inductively-induced negative voltage at the output terminal 6 are simply overcome.

It will also be appreciated that the collector of the transistor 42 could alternatively be coupled to the IC terminal 24, rather than to the IC terminal 22 as described above, since both of these terminals will go below ground level in the event of the relay 34 being de-energized.

Figure 2:
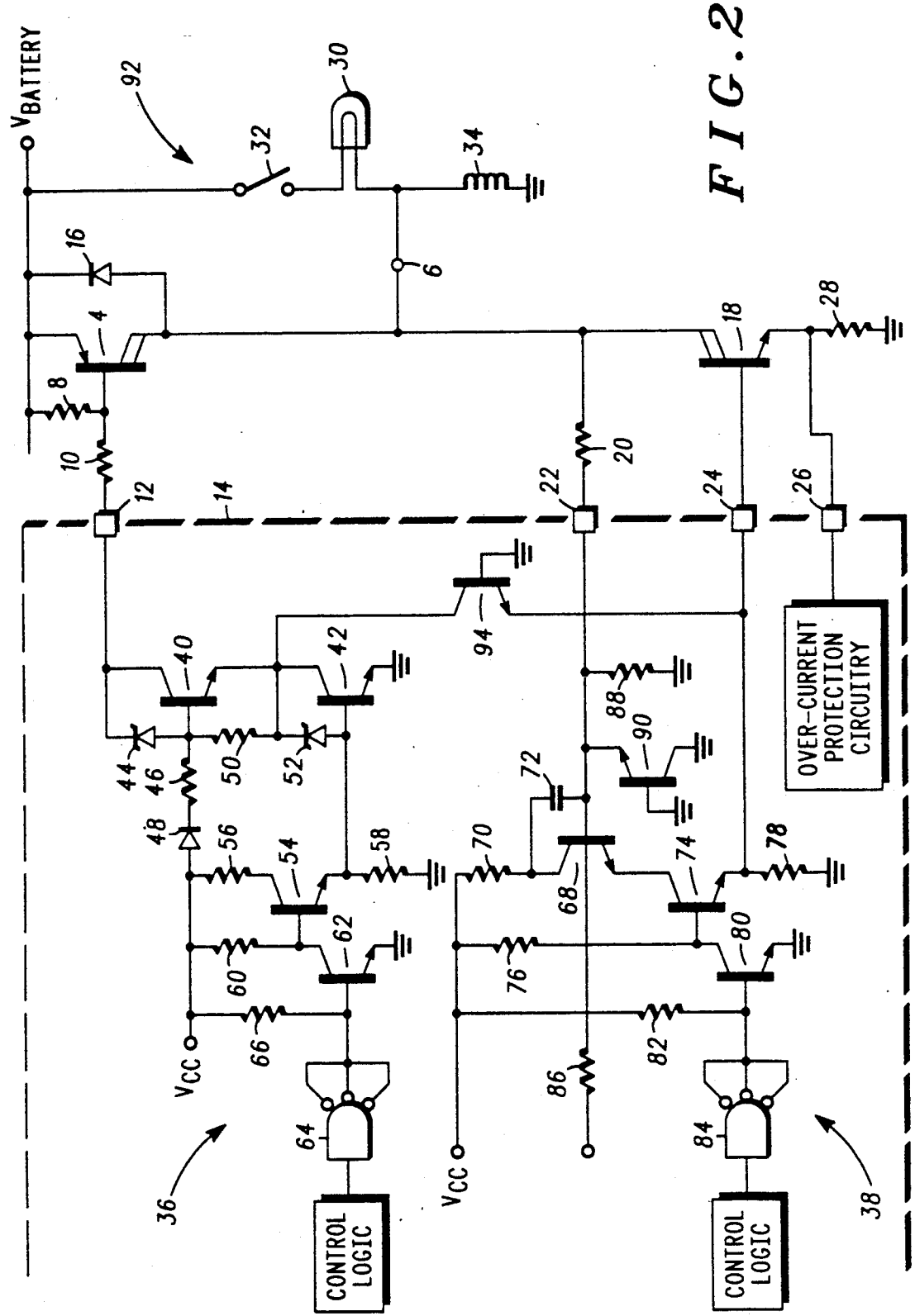
FIG. 2 shows a circuit diagram of a second automotive combined lamp and relay driver circuit.

Referring now to FIG. 2, a second automotive combined lamp and relay driver circuit 92 is largely identical with the already described circuit of FIG. 1. In the circuit of FIG. 2 the same reference numerals have been assigned to like components as in FIG. 1, and the circuit of FIG. 2 will only be discussed in so far as to make clear its differences over the circuit of FIG. 1.

In the circuit of FIG. 2, in place of the connection between the collector of the transistor 90 and the collector of the transistor 42, the transistor 90 in FIG. 2 has its collector connected to ground and a further npn bipolar transistor 94 is provided. The transistor 94 has its collector connected to the collector of the relay pre-driver transistor 42, has its emitter connected to the IC terminal 24, and has its base connected to ground.

The circuit of FIG. 2 functions in exactly the same way as the already described circuit of FIG. 1, the additional transistor 94 serving to sense the negative voltage at the output terminal 6 induced by de-energizing of the relay 34 and to cause the negative voltage to be dissipated through the transistor 42. It will be appreciated that the IC terminal 24 is at a voltage level 1 "diode drop" (the base-collector junction of the transistor 18) less negative than the collector of the transistor 18 and hence less negative than the voltage at the IC terminal 22, and therefore the voltage clamping action of the transistor 94 in the circuit of FIG. 2 will occur at a more negative voltage at the output terminal 6 than produced by the transistor 90 coupling the collector of the transistor 42 to the IC terminal 22 in the circuit of FIG. 1. As a result of this the transient time for dissipation of the inductively-induced negative charge at the output terminal 6 in the circuit of FIG. 2 will be less than that in the circuit of FIG. 1. This will reduce the power dissipation at de-energization which may be suffered by any other electronic components which may be connected to the output terminal 6.

It will be appreciated that although the transistor 90 in FIG. 1 and the transistor 94 in FIG. 2 have been described with their bases connected to ground, they may be falsely triggered by noise. It will be understood that if this is so, the effect can be avoided by connecting the bases of the transistors to logic circuitry (not shown) so that the transistors can be independently enabled by the logic circuitry and so have increased noise immunity.

It will be appreciated that various modifications or alternatives to the above described embodiments will be apparent to the man skilled in the art without departing from the inventive concept.

I claim:

1. A driver circuit comprising:
an output node;
first transistor means for driving a substantially inductive load connected to the output node, the first transistor means having a first current electrode coupled to the output node, a second current electrode for connection to a voltage source coupled to a first control and having a control electrode;
second transistor means for driving a first substantially non-inductive load connected to the output node, the second transistor means having a first current electrode coupled to the output node, a second current electrode for connection to a reference potential and having a control electrode coupled to a second control node; and
compensating means, coupled to the control electrode of the first transistor, for sensing an inductively-induced voltage at the output node when the first transistor means is disabled to cease driving the substantially inductive load and for re-enabling the first transistor means in response thereto to dissipate the inductively-induced voltage at the output node so as to protect the second transistor means.

2. A driver circuit according to claim 1 wherein the compensating means comprises third transistor means.

3. A driver circuit according to claim 2 wherein the third transistor means has current electrodes which are respectively coupled to the control electrode of the first transistor means and connected to the output node.

4. A driver circuit according to claim 2 wherein the third transistor means has current electrodes which are respectively coupled to the control electrode of the first transistor means and connected to the control electrode of the second transistor.

5. A driver circuit according to claim 2 wherein the third transistor means has a control electrode coupled to a node for receiving the reference potential.

6. A driver circuit according to claim 2 further comprising cascode transistor means connected between the control electrode of the first transistor means and a node for connection to the reference potential and wherein the current electrodes of the third transistor means are respectively connected to the cascode transistor means and coupled to the control electrode of the second transistor means.

7. A driver circuit according to claim 1 wherein the second transistor means comprises a high gain Darlington transistor.

8. A driver circuit comprising:
an output node;
first transistor means for driving a substantially inductive load connected to the output node, the first transistor means having a first current electrode coupled to the output node, a second current electrode for connection to a voltage source and having a control electrode coupled to a first control node;
second transistor means for driving a substantially non-inductive load connected to the output node, the second transistor means having a first current electrode coupled to the output node, a second current electrode for connection to a reference potential and having a control electrode coupled to a second control node; and
third transistor means having a first current electrode coupled to the control electrode of the first transistor means, and a second current electrode connected to the output node for sensing an inductively-induced voltage at the output node when the first transistor means is disabled to cease driving the substantially inductive load and for enabling the first transistor means in response thereto to dissipate the inductively-induced voltage at the output node so as to protect the second transistor means.

9. An integrated circuit for enabling first transistor means for driving a substantially inductive load coupled between an output node and a voltage source and second transistor means for driving a substantially non-inductive load coupled between the output node and a reference potential, the integrated circuit comprising:

a first terminal for connection to a control electrode of the first transistor means;

first pre-driver means connected to the first terminal for enabling the first transistor means;

a second terminal for connection to a control electrode of the second transistor means;

second pre-driver means connected to the second terminal for enabling the second transistor means; and compensating means coupled between the first and second terminals for sensing an inductively-induced voltage at the output node when the first transistor means is disabled to cease driving the substantially inductive load and for re-enabling the first transistor means in response thereto to dissipate the inductively-induced voltage at the output node so as to protect the second transistor means.

* * * * *

UNITED STATES PATENT AND TRADEMARK OFFICE
CERTIFICATE OF CORRECTION

PATENT NO. : 5,047,662

DATED : September 10, 1991

INVENTOR(S) : Arthur J. Edwards

It is certified that error appears in the above-identified patent and that said Letters Patent is hereby corrected as shown below:

In claim 1:

At column 6, lines 8 and 9 delete "coupled to a first control"; and at column 6, line 9 after "electrode" insert --coupled to a first control node--.

Signed and Sealed this

Twenty-third Day of March, 1993

*Attest:*

STEPHEN G. KUNIN

*Attesting Officer*  Acting Commissioner of Patents and Trademarks